(12) United States Patent
Takai et al.

(10) Patent No.: US 8,449,204 B2
(45) Date of Patent: May 28, 2013

(54) OPTICAL MODULE

(75) Inventors: Toshiaki Takai, Yokohama (JP); Yukio Sakigawa, Fujisawa (JP); Shohei Hata, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 164 days.

(21) Appl. No.: 13/126,898

(22) PCT Filed: Jun. 11, 2009

(86) PCT No.: PCT/JP2009/060691
§ 371 (c)(1),
(2), (4) Date: Jun. 21, 2011

(87) PCT Pub. No.: WO2010/050265
PCT Pub. Date: May 6, 2010

(65) Prior Publication Data
US 2011/0243512 A1   Oct. 6, 2011

(30) Foreign Application Priority Data

Oct. 31, 2008   (JP) ................................ 2008-280697

(51) Int. Cl.
*G02B 6/36* (2006.01)
*G02B 6/42* (2006.01)

(52) U.S. Cl.
USPC .......................................................... 385/92

(58) Field of Classification Search
USPC .......................................................... 385/92
See application file for complete search history.

(56) References Cited

U.S. PATENT DOCUMENTS

| 2001/0033719 A1 | 10/2001 | Mitsuda et al. |
| 2006/0239311 A1 | 10/2006 | Kume et al. |

FOREIGN PATENT DOCUMENTS

| JP | 2-73208 A | 3/1990 |
| JP | 11-248978 A | 9/1999 |
| JP | 2000-75155 A | 3/2000 |
| JP | 2001-68784 A | 3/2001 |
| JP | 2001-326409 A | 11/2001 |
| JP | 2004-138749 A | 5/2004 |
| JP | 2008-263047 A | 10/2008 |

OTHER PUBLICATIONS

International Search Report dated Sep. 15, 2009 (two (2) pages).

*Primary Examiner* — Omar Rojas
(74) *Attorney, Agent, or Firm* — Crowell & Moring LLP

(57) ABSTRACT

An optical module in a simple configuration is provided which can suppress optical crosstalk due to leakage light without causing characteristics deterioration and reliability decrease of light-emitting elements to thereby obtain appropriate light receiving sensitivity. In an optical module in which a plurality of light-emitting elements 11 and light-receiving elements 12 are mounted on an optical-element mounting substrate 1, a light-absorbing resin 6 to absorb light with a light-emission wavelength of the light-emitting elements 11 is arranged to cover side surfaces of the light-emitting elements 11 and a non-adhesive layer 7 including a material not adhesive to the light-absorbing resin 6 is arranged between the light-absorbing resin 6 and the optical-element mounting substrate 1.

17 Claims, 7 Drawing Sheets

(a)

(b)

OPTICAL MODULE

INCORPORATION BY REFERENCE

The present application claims priority from Japanese application JP2008-280697 filed on Oct. 31, 2008, the content of which is hereby incorporated by reference into this application.

TECHNICAL FIELD

The present invention relates to an optical module in which light-emitting elements and light-receiving elements are mounted in one housing, the optical module including a configuration to suppress optical crosstalk.

BACKGROUND ART

In an optical module such as a light transmitting and receiving module in which light-emitting elements (semiconductor lasers) and light-receiving elements (photodiodes) are disposed in one housing, suppression of optical crosstalk has been quite an important factor to obtain good light receiving sensitivity. As the causes of the optical crosstalk, there exist mainly two paths as follows. The first path is such that light emitted from a light-emitting element is scattered by inner walls of the housing and then reaches a light-receiving element. The second path is such that light leaked from an active layer of the light-emitting element (semiconductor laser) into a substrate (to be referred to as leakage light hereafter) is emitted from a side wall of the light-emitting element into the outside and then directly reaches the light-receiving element or is scattered by the inner walls of the housing and then reaches the light-receiving element. To suppress the optical crosstalk, various methods have been conventionally devised.

For example, Patent literature 1 describes an optical module in which a light-emitting element and a light-receiving element are mounted on a substrate and a wavelength-selecting filter is inserted between the light-emitting element and the light-receiving element to reflect stray light from the light-emitting element, to thereby suppress optical crosstalk.

Also, Patent literature 2 and Patent literature 3 describe an optical module in which a plurality of optical semiconductor elements are mounted on a substrate and a light-absorbing resin (or light shielding resin) is arranged between the plurality of optical semiconductor elements to form a configuration to suppress optical crosstalk between the elements in which, after peripheral areas of the optical semiconductor elements are covered with a transparent resin, the surface of the substrate including the transparent resin is coated with the light-absorbing resin (or the light-shielding resin).

CITATION LIST

Patent Literature

Patent literature 1: JP-A-11-248978
Patent literature 2: JP-A-2000-75155
Patent literature 3: JP-A-02-73208

SUMMARY OF INVENTION

Technical Problem

In the Patent literature 1, since a wavelength-selecting filter is inserted between the light-emitting element and the light-receiving element, it is possible to interrupt the light which directly enters the light-receiving element from the light-emitting element. However, in this configuration, the wavelength-selecting filter does not effectively function for the path (the second path described above) through which the light (leakage light) emitted into the rear side (the opposite side with respect to the wavelength-selecting filter) of the light-emitting element is scattered by the inner walls of the housing and then enters the light-receiving element. In other words, the optical crosstalk caused by the leakage light (the second path described above) cannot be suppressed in the configuration.

According to the Patent literatures 2 and 3, in consideration of the suppression of the optical crosstalk caused by the leakage light (the second path described above), a construction is used in which the light-emitting elements are completely covered with the resin and the resin is adhered to the substrate. However, in this construction, since the resin is adhered to the substrate, distortion is generated in the light-emitting elements due to thermal contraction of the resin. In other words, the gap of the diffraction grating changes in the light-emitting elements. The change in the diffraction grating gap is likely to cause a change in the light-emission wavelength. Further, due to the distortion, there is a possibility that the reliability of the light-emitting elements is lowered. Also, in the configuration of the Patent literatures 2 and 3, leakage light not absorbed (interrupted) by the resin is likely to cause optical crosstalk.

As described above, in an optical module in which light-emitting elements and light-receiving elements are disposed in one housing, it is difficult according to the prior art to suppress the optical crosstalk due to the leakage light (the second path) without causing the characteristics deterioration and the reliability decrease of the light-emitting elements.

It is an object of the present invention to provide, in consideration of the situation above, an optical module in a simple configuration which can suppress the optical crosstalk due to the leakage light without causing the characteristics deterioration and the reliability decrease of the light-emitting elements, to thereby obtain good light receiving sensitivity.

Solution to Problem

To solve the problem, there is provided either one of the features below.

According to the present invention, on a substrate to mount thereon optical elements (light-emitting elements and light-receiving elements), there is arranged an area in which a material not adhesive to resin is formed. Further, it has a feature that light absorbing efficiency is improved by combining a light-absorbing resin with a light reflecting material.

Specifically, in an optical module in which a plurality of light-emitting elements and light-receiving elements are mounted on a substrate, a light-absorbing resin to absorb light having a light-emission wavelength of the light-emitting elements is arranged to cover side surfaces of the light-emitting elements and a non-adhesive material not adhesive to the light-absorbing resin is arranged between the light-absorbing resin and the substrate. By adopting this construction, it enables to suppress distortion in the light-emitting elements due to thermal contraction of the resin.

Further, in an optical module in which a plurality of light-emitting elements and light-receiving elements are mounted on a substrate, a light-absorbing resin to absorb light having the light-emission wavelength of the light-emitting elements is arranged to cover the side surfaces of the light-emitting elements and a non-adhesive material not adhesive to the light-absorbing resin is arranged between the light-absorbing resin and the substrate, and a reflecting material to reflect light having a light-emission wavelength of the light-emitting elements is arranged to cover an upper surface of the light-absorbing resin. By adopting this construction, it enables to suppress distortion in the light-emitting elements due to thermal contraction of the resin and to improve light absorption efficiency of the light-absorbing resin.

Further, in an optical module in which a plurality of light-emitting elements and light-receiving elements are mounted on a substrate, light-absorbing resin to absorb light having a light-emission wavelength of the light-emitting elements is arranged to enclose peripheral areas of the light-emitting elements, and a light reflecting material to reflect light having a light-emission wavelength of the light-emitting elements is arranged to cover the outer circumference of the light-absorbing resin. By adopting this construction, it enables to suppress distortion in the light-emitting elements due to thermal contraction of the resin and to improve the light absorption efficiency of the light-absorbing resin.

Further, in an optical module in which a plurality of light-emitting elements and light-receiving elements are mounted on a substrate, there are employed light-emitting elements in which side surfaces of the light-emitting elements are coated with light-absorbing resin to absorb light having a light-emission wavelength of the light-emitting elements. By adopting this construction, it enables to suppress distortion in the light-emitting elements due to thermal contraction of the resin and to improve the light absorption efficiency of the light-absorbing resin.

ADVANTAGEOUS EFFECTS OF INVENTION

By adopting the construction according to the present invention, it enables to provide an optical module in a simple configuration which can suppress the optical crosstalk due to the leakage light without causing the characteristics deterioration and the reliability decrease of the light-emitting elements, to thereby obtain good receiving sensitivity.

Other objects, features, and advantages of the present invention will be clarified through the following description of examples of the present invention in conjunction with accompanying drawings.

DESCRIPTION OF EMBODIMENTS

Figure 1:
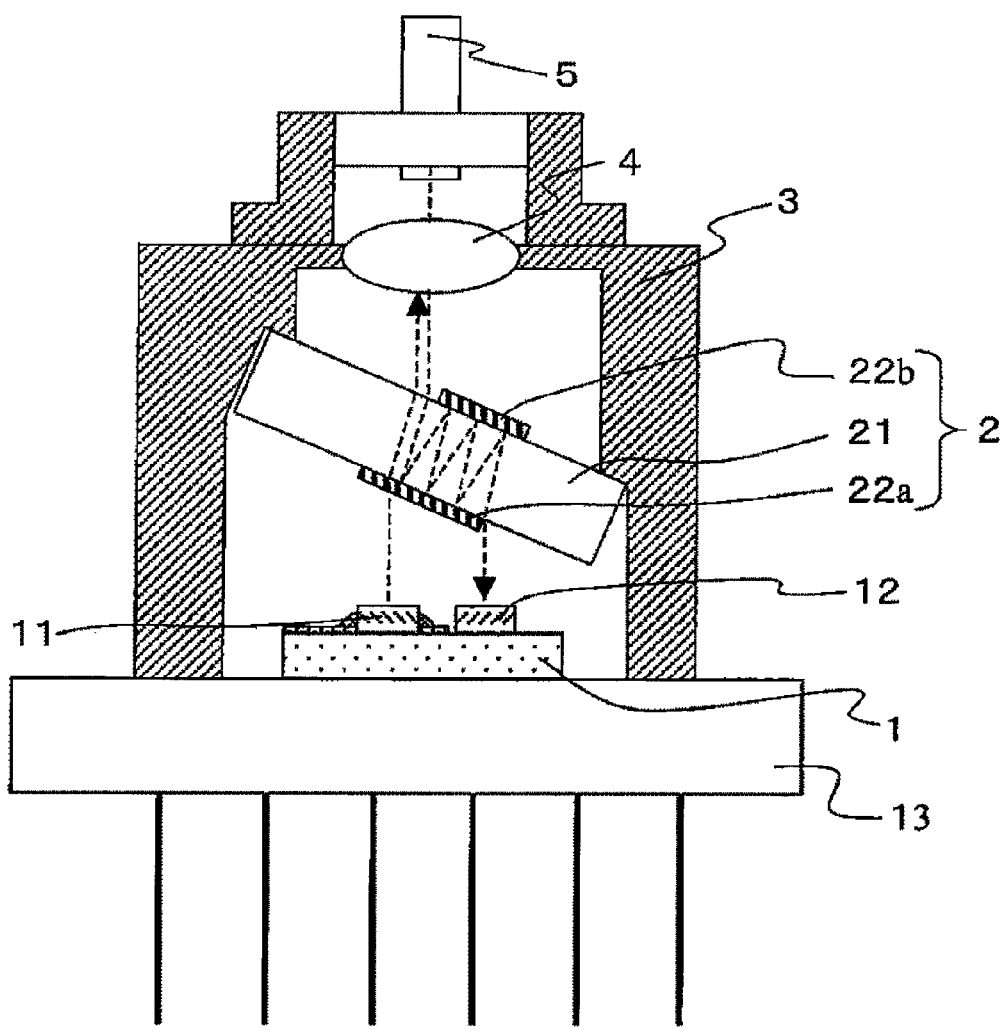
FIG. 1 is a diagram to explain the overall structure of a single-core bidirectional light transmitting and receiving module common to respective embodiments according to the present invention.

Next, description will be given of embodiments of the present invention by use of examples and by referring to the drawings. In this regard, substantially the same components will be assigned with the same reference numerals and will not be repeatedly described.

First, description will be given of the basic configuration of the single-core bidirectional light transmitting and receiving module common to the respective embodiments by referring to FIGS. 1 and 2.

Figure 2:
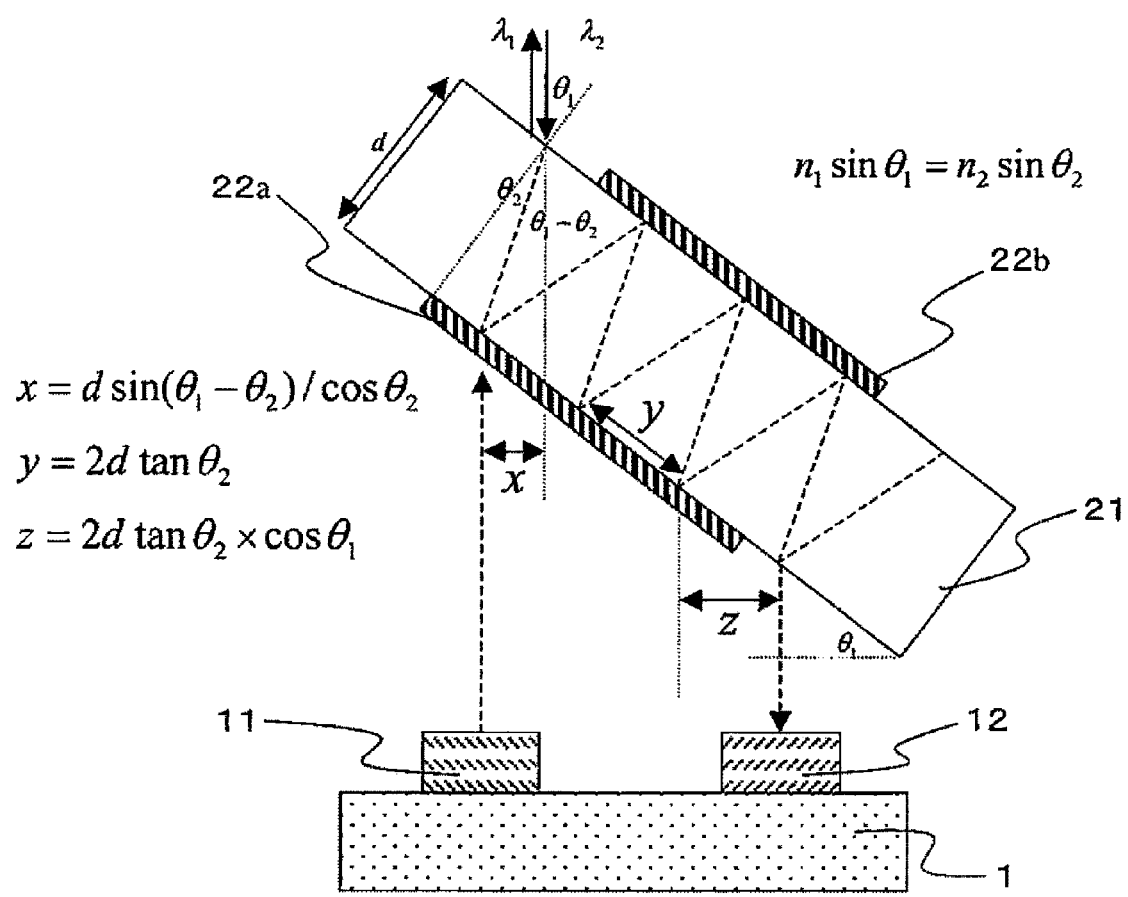
FIG. 2 is a diagram to explain the details of light demultiplexing and multiplexing functions of an optical multiplexer and demultiplexer in a single-core bidirectional light transmitting and receiving module common to respective embodiments according to the present invention.

FIG. 1 is a cross-sectional view to explain the overall structure of a single-core bidirectional light transmitting and receiving module employing two wavelengths according to the present invention. FIG. 2 is a diagram to explain the details of light demultiplexing and multiplexing functions of an optical multiplexer and demultiplexer in the single-core bidirectional light transmitting and receiving module of the present example.

First, referring to FIG. 1, description will be given of the basic structure of the single-core bidirectional light transmitting and receiving module employing two wavelengths. In this module, an optical-element mounting substrate 1, on which a light-emitting element 11 to conduct transmission and a light-receiving element 12 to conduct receiving are mounted, is mounted on a can stem 13, and an optical multiplexer and demultiplexer 2 is mounted in a housing 3. The light-emitting element 11 includes, in its upper surface, a light emitting portion to convert an electric signal into an optical signal to emit light therefrom; the light-receiving element 12 includes, in its upper surface, a light receiving portion to convert an optical signal into an electric signal. The optical elements 11 and 12 have operative wavelengths $\lambda_1$ and $\lambda_2$, respectively, and these wavelengths have a relationship of $\lambda_1 < \lambda_2$. In the inside of the housing 3, depressions and protrusions are arranged to enable mounting the optical multiplexer and demultiplexer 2. The optical multiplexer and demultiplexer 2 includes a transparent substrate 21 as a supporting substrate; on a first surface thereof, a first wavelength-selecting filter 22a is formed; on a surface which is parallel to and facing the first surface, a second wavelength-selecting filter 22b is formed. The optical multiplexer and demultiplexer 2 is mounted by matching its contour with the depressions and the protrusions of the housing 3 and is adhered thereto by a UV-setting resin. The transparent substrate 21 is made of BK7. The transparent substrate 21 is mounted to have an angle with respect to a plane. The wavelength-selecting filters 22a and 22b include dielectric multilayer films formed of $Ta_2O_5$ and $SiO_2$. The wavelength-selecting filters 22a and 22b are filters (so-called short-pass filters) having a separation wavelength $\lambda_{th}$ in a range of $\lambda_1 < \lambda_{th} < \lambda_2$, the filters having a characteristic to transmit light having a wavelength smaller than $\lambda_{th}$ and to reflect light having a wavelength greater than $\lambda_{th}$.

Light having wavelength $\lambda_1$ emitted from the light-emitting element 11 reaches the first wavelength-selecting filter 22a. The first wavelength-selecting filter 22a transmits the light having wavelength $\lambda_1$, a light path of which is displaced in parallel by refraction in the transparent substrate 21, and is optically coupled via a lens 4 with an optical fiber 5.

On the other hand, light having wavelength $\lambda_2$ emitted from the optical fiber enters the transparent substrate 21 via the lens 4, refracted by the transparent substrate 21 and then reaches the first wavelength-selecting filter 22a. The light having wavelength $\lambda_2$ emitted from the optical fiber is reflected by the first wavelength-selecting filter 22a and reaches the opposing second wavelength-selecting filter 22b. Since the opposing second wavelength-selecting filter 22b is the same as the first wavelength-selecting filter 22a, the light having wavelength $\lambda_2$ is reflected again.

The light reflected by the second wavelength-selecting filter 22b again enters the transparent substrate 21. In this situation, according to a most simple design, there is employed a configuration in which the light reflected by the second wavelength-selecting filter 22b (the light that again enters the transparent substrate 21) enters a position where the first wavelength-selecting filter 22a is not formed, and then the light having wavelength $\lambda_2$ is emitted from the optical multiplexer and demultiplexer 2 in a direction toward a lower portion on the page sheet, and enter the light-receiving element 12.

However, according to the present example, a design is employed in which the reflected light from the second wavelength-selecting filter 22b again enters the first wavelength-selecting filter 22a to further reciprocate twice between the first and second wavelength-selecting filter 22a and 22b. This is for increasing the gap between the first and second wavelength-selecting filters 22a and 22b, because there exists a possibility that an optical element which operates at high speed is a source of noise (to be called electric crosstalk) for the side of the light-receiving element. In a situation in which there exists no other particular reason such as the electric crosstalk, it is favorable to employ a configuration in which the number of the reflecting operations is minimized by matching the pitch of the multiple reflections in the glass substrate with the element mounting pitch.

In the present example, the light having reciprocated three times between the first and second wavelength-selecting filters 22a and 22b transmits through the position where the first wavelength-selecting filter 22a is not formed, and enters the light-receiving element 12.

Now, description will be given of the details of the light demultiplexing and multiplexing functions of the optical multiplexer and demultiplexer 2 in the present example by referring to FIG. 2. When the angle of the optical multiplexer and demultiplexer 2 is $\theta_1$, light from the fiber 5 or the light-emitting element 11 enters the optical multiplexer and demultiplexer 2 with angle $\theta_1$ relative to the perpendicular direction of the surface of the optical multiplexer and demultiplexer 2. A refraction angle $\theta_2$ at incidence to the transparent substrate 2 is given by $\theta_2=\sin^{-1}(n_1 \cdot \sin \theta_1/n_2)$ according to Snell's law, where $n_i$ is a refractive index of the outside and $n_2$ is a refractive index of the transparent substrate 21. Therefore, a distance x of the parallel-directional displacement of the light from the light-emitting element 11 between the light incidence position and the light emitting position in the optical multiplexer and demultiplexer 2 is given by $d \cdot \sin(\theta_1-\theta_2)/\cos \theta_2$, where d is a thickness of the transparent substrate 21.

In this situation, a length y of the multiple reflection period in the substrate is given by $2d \cdot \tan \theta_2$. Also, in a situation in which the multiple-reflected light is wavelength-separated by the filter according to the principle described above and is emitted to a plane perpendicular to the optical axis at the incidence of the light, a length z of the period in the parallel direction is given by $2d \cdot \sin \theta_2 \cdot \cos \theta_1$. In the present example, a configuration is employed in which light reciprocates three times in the optical multiplexer and demultiplexer 2. In this situation, the light-emitting element 11 and the light-receiving element 12 are mounted at positions on the element mounting substrate such that the light emitting point of the light-emitting element 11 is apart by 3z from the light receiving point of the light-receiving element 12. Hence, it is required to select d and $\theta_1$ to keep an appropriate gap between the elements.

Incidentally, according to the present example, a vertical-emission type LD in which microlenses are integrated is employed as the light-emitting element 11 on the optical-element mounting substrate 1. Although the vertical-emission type LD is desirable for simplicity in the mounting thereof, an edge-emission type LD may also be employed as the light-emitting element 11. Further, the lens-integration type is desirable for easiness of optical coupling and reduction in the number of parts; however, naturally, there is no need to stick to this type.

A surface-incidence type PD is employed as the light-receiving element 12 for the similar reason; however, naturally, there is no need to stick to this type.

Also, an amplifier IC and a chip capacitor are mounted on the can stem 14 or the optical-element mounting substrate 1; however, this is similar to the ordinary case and so is not shown.

Embodiment 1

Figure 3:
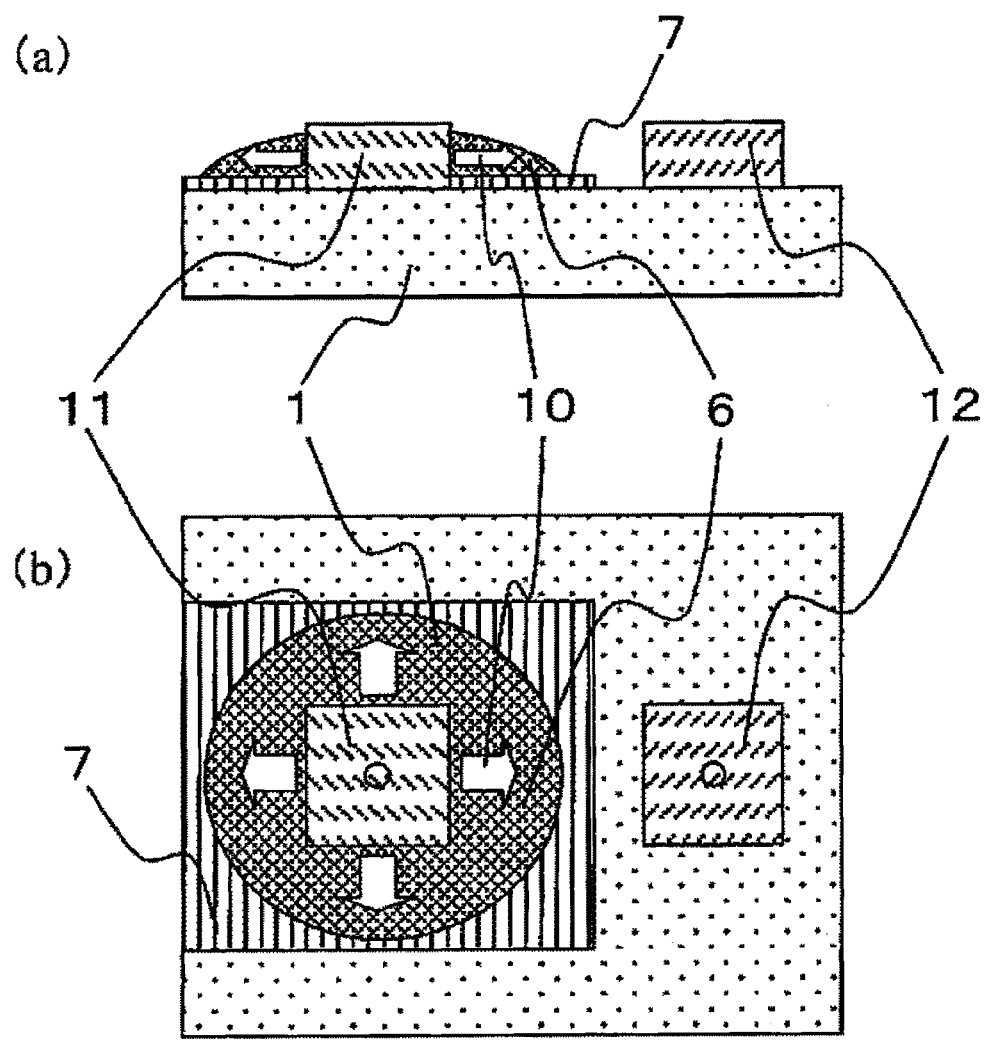
FIG. 3 is a diagram to explain a first embodiment according to the present invention.

Description will be given of a first embodiment of the present invention by referring to FIG. 3. FIG. 3, (a) is a plan view illustrating details of an optical-element mounting section in the present example, and FIG. 3, (b) is a cross-sectional view illustrating details of the optical-element mounting section in the present example.

In this example, for a single-core bidirectional light transmitting and receiving module configured as represented in FIG. 1, a light-absorbing resin 6 to absorb light having an emission wavelength $\lambda_1$ of the light-emitting element 11 is arranged to cover side surfaces of the light-emitting element 11. Details of the optical-element mounting section will be described by referring to FIG. 3.

As the light-absorbing resin 6, a UV-setting type resin is employed to absorb the light having emission wavelength $\lambda_1$ of the light-emitting element 11. The light-emitting element 11 and a non-adhesive layer 7 are disposed on a substrate and then the UV-setting resin is applied by a dispenser onto the side surfaces of the light-emitting element 11 and on the non-adhesive layer 7; thereafter, a UV ray is radiated to harden the light-absorbing resin 6. As a result, leakage light 10 from the side surfaces of the light-emitting element 11 is absorbed by the light-absorbing resin 6. Hence, the leakage light 10 incident on the light-receiving element 12 can be reduced through the scattering of light directly from the side surfaces of the light-emitting element 11 or the scattering of light in the housing 3, to thereby enable suppression of the optical crosstalk.

Moreover, between the light-absorbing resin 6 and the optical-element mounting substrate 1, the non-adhesive layer 7 is formed including a material which does not adhere to the light-absorbing resin 6. In this example, Teflon (R) is employed as the material of the non-adhesive layer 7, and the non-adhesive layer 7 is beforehand formed through a Teflon (R) coating on the optical-element mounting substrate 1 before the light-emitting element 11 is connected thereto. As a result, the light-absorbing resin 6 is in such a state that the light-absorbing resin 6 does not make contact with the optical-element mounting substrate 1 and is brought into contact only with the side surfaces of the light-emitting element 11. When the light-absorbing resin 6 contracts due to a change in temperature in this state, the light-absorbing resin 6 contracts toward the outer circumference of the light-emitting element 11 relative to the side surfaces of the light-emitting element 11. In other words, since being not restricted by the light-absorbing resin 6 and the optical-element mounting substrate 1, no stress (distortion) is generated in the light-emitting element 11 by the contraction of the light-absorbing resin 6.

Incidentally, the present example employs the UV-setting resin as the light-absorbing resin 6 to absorb light having the wavelength $\lambda_1$; however, it is not required to stick to this structure, and it is also possible to employ, for example, a mixture including a material (powder) to absorb light having the wavelength $\lambda_1$ and the UV-setting resin. Also, a black sealing resin may be used.

Additionally, the non-adhesive layer 7 is formed through the Teflon (R) coating in the present example; however, this is naturally not restrictive to it if only a material not adhesive to the light-absorbing resin 6 is used.

In the present example, description has been given of an example of a single-core bidirectional light transmitting and receiving module as shown in FIG. 1; however, the present example is not restricted by this configuration, but is applicable to an optical module including the light-emitting and light-emitting elements in one housing. This also applies to the following examples.

EXAMPLE 2

Figure 4:
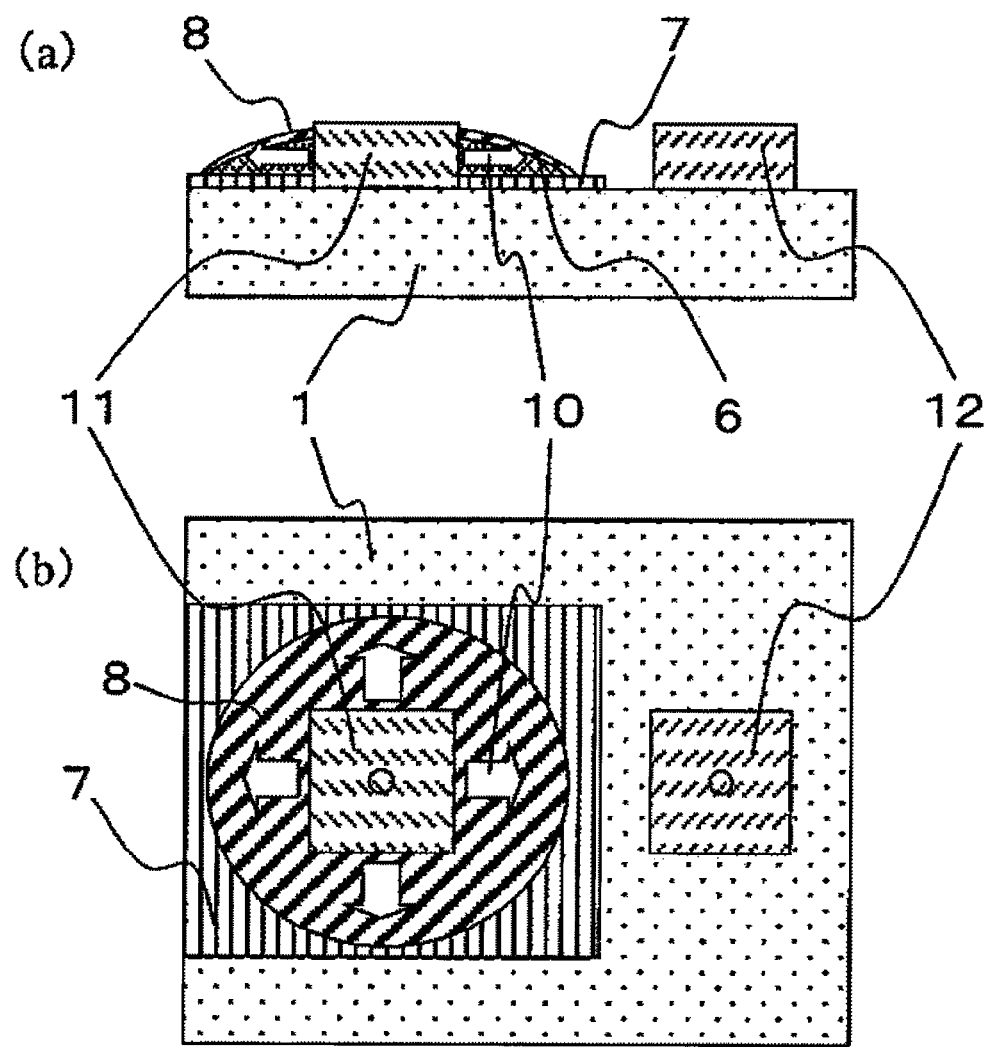
FIG. 4 is a diagram to explain a second embodiment according to the present invention.

Description will be given of a second example of the present invention by referring to FIG. 4. FIG. 4, (a) is a plan view illustrating details of an optical-element mounting section in the present example, and FIG. 4, (b) is a cross-sectional view illustrating details of the optical-element mounting section in the present example.

In the present example, in addition to the configuration of example 1, a reflecting material 8 which reflects the light having the wavelength $\lambda_1$ from the light-emitting element 11 covers an upper surface of the light-absorbing resin 6. In this example, a thermosetting-type white paste is employed as the reflecting material 8. After the light-absorbing resin 6 is UV-hardened, the reflecting material 8 is supplied using a dispense method. After the reflecting material 8 is supplied, the configuration of FIG. 4 is implemented by conducting thermal hardening. As a result, leakage light not absorbed by the light-absorbing resin 6 is reflected by the reflecting material 8 to be absorbed again by the light-absorbing resin 6. Therefore, the leakage light absorbing efficiency is improved and the optical crosstalk can be reduced.

Although the white paste is employed in the present example as the light-absorbing resin 6, it is also possible to use a metallic thin film. By forming a metallic thin film on the light-absorbing resin 6 by evaporation, the film can reflect, like the white paste, the leakage light 10 not absorbed by the light-absorbing resin 6.

Additionally, in place of the reflecting material 8, a resin may also be employed having a refractive index at the wavelength $\lambda_1$ other than that of the light-absorbing resin 6 at the wavelength $\lambda_1$. In this situation, Fresnel reflection takes place at the boundary between the light-absorbing resin 6 and the reflecting material 8 due to a difference in the refractive index between the light-absorbing resin 6 and the reflecting material 8. A reflection factor R of the Fresnel reflection is represented as $R=(n_4-n_3)^2/(n_4+n_3)^2 \times 100(\%)$ by assuming that the refractive index of the light-absorbing resin 6 at the wavelength $\lambda_1$ is $n_3$, the refractive index of the reflecting material 8 at the wavelength $\lambda_1$ is $n_4$, and the light perpendicularly enters the reflecting material 8. Specifically, for $n_3=1.2$ and $n_4=1.5$, reflection factor $R=(1.5-1.2)^2/(1.5+1.2)^2 \times 100 \approx 3.4(\%)$. Hence, 3.4% of the light not absorbed by the light-absorbing resin 6 is again absorbed by the light-absorbing resin 6.

Also in the present example, due to the presence of the non-adhesive layer 7, both of the light-absorbing resin 6 and the reflecting material 8 are not adhered onto the optical-element mounting substrate 1. Hence, as in example 1, it is possible to suppress the occurrence of distortion in the light-emitting element 11 due to the contraction of the light-absorbing resin 6 and the reflecting material 8 with a change in temperature.

EXAMPLE 3

Description will be given of a third example of the present invention by referring to FIG. 5.

Figure 5:
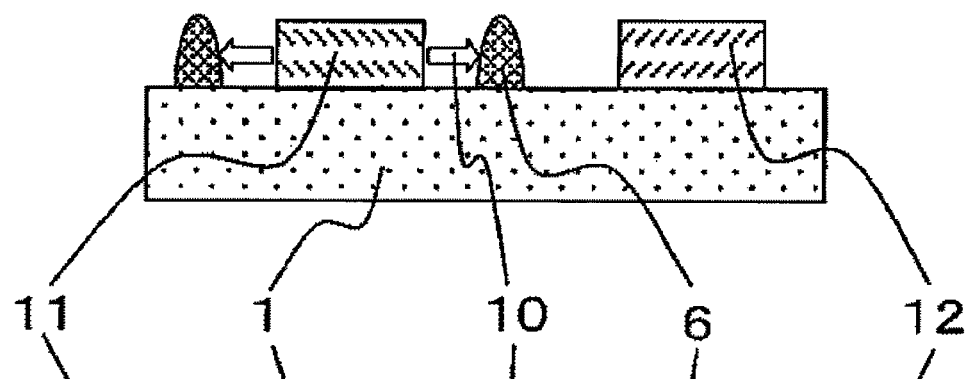
FIG. 5 is a diagram to explain a third embodiment according to the present invention.
Figure 5:
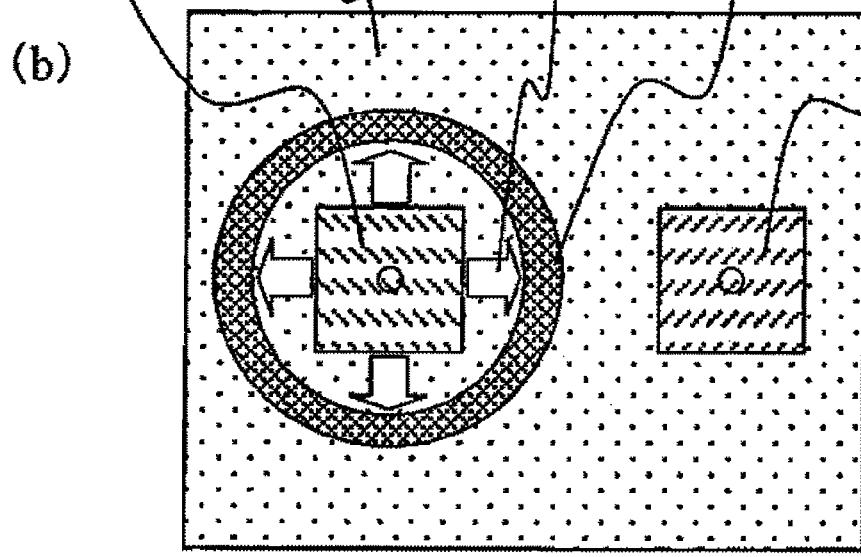

FIG. 5, (a) is a plan view illustrating details of an optical-element mounting section in the present example, and FIG. 5, (b) is a cross-sectional view illustrating details of the optical-element mounting section in the present example.

In the present example, in the single-core bidirectional light transmitting and receiving module as illustrated in FIG. 1, the light-absorbing resin 6 to absorb light having the wavelength $\lambda_1$ from the light-emitting element 11 is arranged to enclose the periphery of the light-emitting element 11. Details of the optical-element mounting section will be described by referring to FIG. 3.

In the periphery of the light-emitting element 11, there is employed a UV-setting resin to absorb the light having the wavelength $\lambda_1$ from the light-emitting element 11. The periphery of the optical element 11 mounting section on the optical-element mounting substrate 1 is coated with the light-absorbing resin 6 by a transfer method, and then the light-absorbing resin 6 is hardened through a UV radiation. As a result, the periphery of the light-emitting element 11 is enclosed by a wall of the light-absorbing resin 6. In this configuration, the leakage light 10 emitted from the side surfaces of the light-emitting element 11 is absorbed by the wall of the light-absorbing resin 6. Therefore, by the scattering of light directly from the side surfaces of the light-emitting element 11 or the scattering in the housing 3, it is possible to reduce the leakage light 10 which enters the light-receiving element 12.

In the configuration of the present example, the light-absorbing resin 6 does not make contact with the light-emitting element 1. Hence, as in example 1, even if the non-adhesive layer 7 is not formed on the optical-element mounting substrate 1, no distortion is generated in the light emitting element 1 even when contraction takes place in the light-absorbing resin 6 with a change in temperature.

Incidentally, the present example employs the UV-setting resin to absorb the light having the wavelength $\lambda_1$ as the light-absorbing resin 6; however, as in example 1, it is not required to stick to this configuration, and, for example, a mixture may also be employed including a material (powder) to absorb the light having the wavelength $\lambda_1$ and the UV-setting resin. Also, a black sealing resin may be used.

EXAMPLE 4

Figure 6:
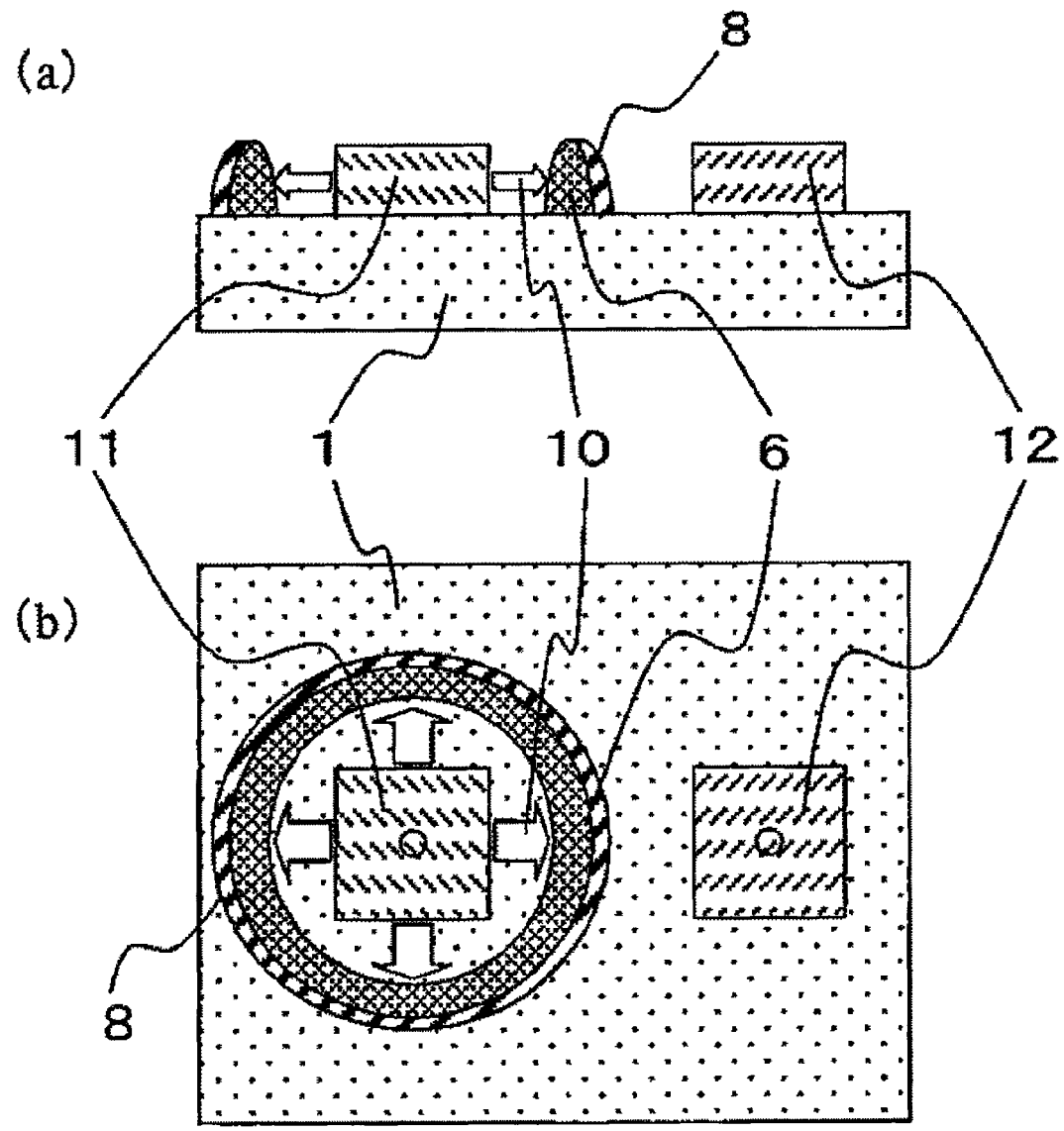
FIG. 6 is a diagram to explain a fourth embodiment according to the present invention.

Description will be given of a fourth example of the present invention by referring to FIG. 6. FIG. 6, (a) is a plan view illustrating details of an optical-element mounting section in the present example, and FIG. 6, (b) is a cross-sectional view illustrating details of the optical-element mounting section in the present example.

In the present example, in addition to the configuration of example 3, a reflecting material 8 which reflects the light having the wavelength $\lambda_1$ from the light-emitting element 11 is arranged to cover the outer circumference of the light-absorbing resin 6. In this example, a thermosetting-type white paste is employed as the reflecting material 8. After the light-absorbing resin 6 is UV-hardened, the reflecting material 8 is supplied using the dispense method to cover the outer circumference of the light-absorbing resin 6. After the reflecting material 8 is supplied, the configuration of FIG. 6 is implemented by conducting thermal hardening. As a result, leakage light 10 not absorbed by the wall of the light-absorbing resin 6 is reflected by the reflecting material 8 to be absorbed again by the light-absorbing resin 6. Therefore, the leakage light 10 absorbing efficiency is improved and the optical crosstalk can be reduced.

Also in the configuration of the present example, the light-absorbing resin 6 does not make contact with the light-emitting element 1. Hence, as in example 1, even if the non-adhesive layer 7 is not formed on the optical-element mounting substrate 1, no distortion is generated in the light emitting element 1 even when contraction takes place in the light-absorbing resin 6 with the change in temperature.

In the present example, the white paste is employed as the reflecting material 8; however, as in example 2, in place of this, a metallic thin film or a resin having a refractive index at the wavelength $\lambda_1$ other than that of the reflecting material 8 at the wavelength $\lambda_1$ may also be employed.

EXAMPLE 5

Figure 7:
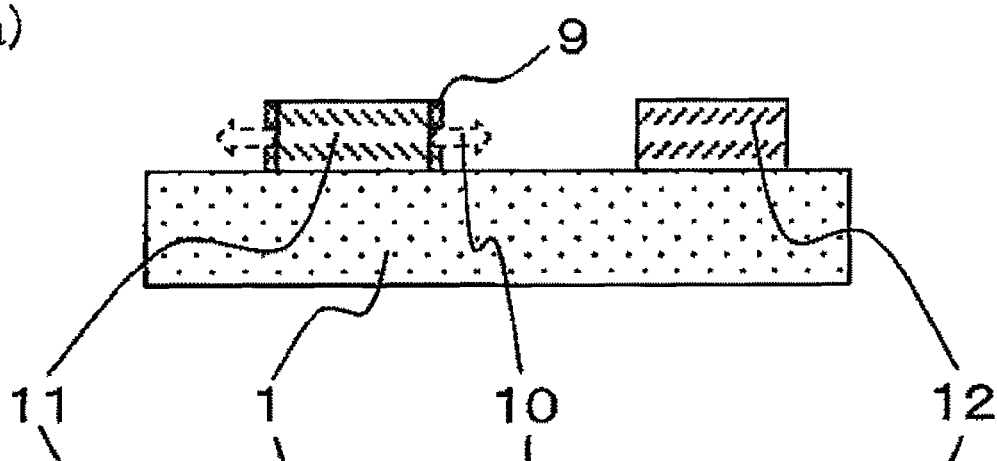
FIG. 7 is a diagram to explain a fifth embodiment according to the present invention.
Figure 7:
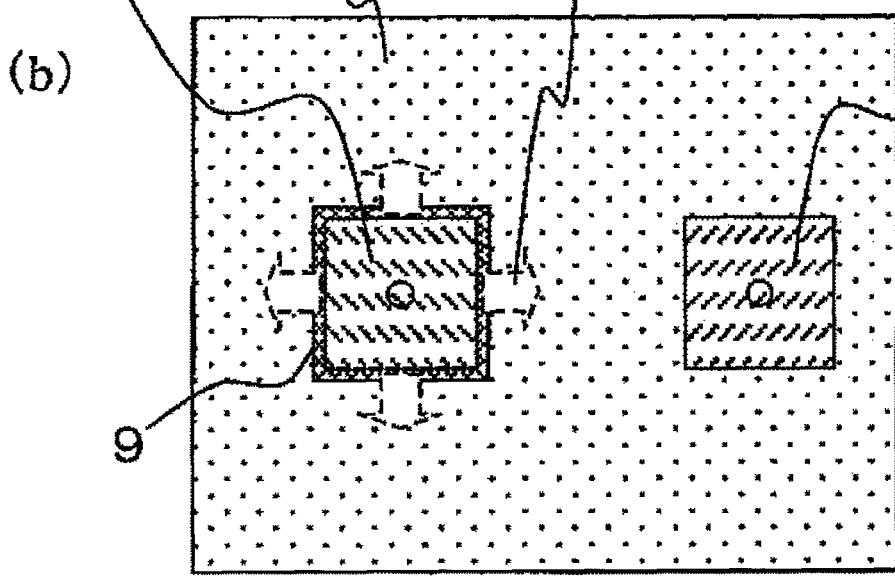

Description will be given of a fifth example of the present invention by referring to FIG. 7. FIG. 7, (a) is a plan view illustrating details of an optical-element mounting section in the present example, and FIG. 7, (b) is a cross-sectional view illustrating details of the optical-element mounting section in the present example.

In this example, in a single-core bidirectional light transmitting and receiving module configured as shown in FIG. 1, there is employed a light-emitting element 11 having the side surfaces coated with a material which absorbs the light with light-emission wavelength $\lambda_1$ of the light-emitting element 11. Details of the optical-element mounting section will be described by referring to FIG. 3.

As the material of the coating layer on the side surfaces of the light-emitting element 11, the present example employs the light-absorbing resin which absorbs the light having a light-emission wavelength $\lambda_1$ of the light-emitting element 11. The coating layer 9 is beforehand formed by spaying the light-absorbing resin before the light-emitting element 11 is mounted on the optical-element mounting substrate 1. As a result, leakage light 10 from the side surfaces of the light-emitting element 11 is absorbed by the coating layer 9. Hence, through the scattering of light directly from the side surfaces of the light-emitting element 11 or the scattering of light in the housing 3, the leakage light incident on the light-receiving element 12 can be reduced and the optical crosstalk can be suppressed.

Further, since the light-emitting element 11 with side surfaces coated in advance is mounted on the optical-element mounting substrate, the coating layer 9 does not adhere to the optical-element mounting substrate 1. Hence, even if the temperature changes in this construction, substantially no distortion is generated in the light-emitting element 11 due to contraction in the coating layer 9.

Incidentally, a light-absorbing resin is employed as the material of the coating layer 9 in the present example; however, any material may be employed only if the material absorbs light having the light-emission wavelength $\lambda_1$; desirably, a material which is easy to be sprayed is appropriately used.

While description has been given of examples, the present invention is not to be restricted by those examples, and it is to be appreciated by those skilled in the art that various changes and modifications may be made thereto without departing from the spirit and scope of the invention as set forth in the claims.

Industrial Applicability

The present invention may be used in fields in which an information communication apparatus employing an optical module including light-emitting and light receiving elements is employed, for example, for an optical communication module, an optical recording module, a high-speed switching apparatus (a router, a server, etc.), and the like.

Reference Signs List
1 Optical-element mounting substrate
10 Leakage light
11 Light-emitting element
12 Light-receiving element
2 Optical multiplexer and demultiplexer
21 Transparent substrate
22*a*, 22*b* Wavelength-selecting filter
3 Can stem
31 Optical waveguide core
4 Lens
5 Optical fiber
6 Light-absorbing resin
7 Non-adhesive layer
8 Reflecting material
9 Coating material

The invention claimed is:

1. An optical module comprising:
a substrate,
a light-emitting element which is disposed on the substrate and which comprises a light-emitting portion on an upper surface thereof, and
a light-receiving element disposed on the substrate,
wherein a light-absorbing resin to absorb light having a light-emission wavelength of the light-emitting element is arranged to cover side surfaces of the light-emitting element; and
wherein a member of a non-adhesive material not adhesive to the light-absorbing resin is arranged between the light-absorbing resin and the substrate.

2. An optical module according to claim 1, wherein
a reflecting material to reflect the light having the light-emission wavelength of the light-emitting element is arranged to cover an upper surface of the light-absorbing resin.

3. An optical module according to claim 2, wherein
the reflecting material is resin.

4. An optical module, comprising:
a substrate;
a light-emitting element disposed on the substrate; and
a light-receiving element disposed on the substrate,
wherein a light-absorbing resin to absorb light having a light-emission wavelength of the light-emitting element is arranged to enclose the periphery of the light-emitting element, and
wherein a member of a non-adhesive material not adhesive to the light-absorbing resin is arranged between the light-absorbing resin and the substrate.

5. An optical module according to claim 4, wherein
a light reflecting material to reflect light having the light-emission wavelength of the light-emitting element is arranged to cover the outer circumference of the light-absorbing resin.

6. An optical module according to claim 5, wherein the reflecting material is resin.

7. An optical module according to claim 1, wherein
the light-absorbing resin is configured by mixing a transparent resin with a light absorbing material to absorb light having the light-emission wavelength of the light-emitting elements.

8. An optical module according to claim 4, wherein
the light-absorbing resin is configured by mixing a transparent resin with a light absorbing material to absorb the light having the light-emission wavelength of the light-emitting element.

9. An optical module according to claim 1, wherein the light-absorbing resin includes a black sealing resin.

10. An optical module according to claim 4, wherein the light-absorbing resin includes a black sealing resin.

11. An optical module according to claim 1, wherein the non-adhesive material is Teflon (R).

12. An optical module according to claim 3, wherein the reflecting material includes a white paste.

13. An optical module according to claim 6, wherein the reflecting material includes a white paste.

14. An optical module according to claim 3, wherein
the reflecting material includes a resin having a refractive index at the light-emission wavelength of the light-emitting element other than a refractive index of the light-absorbing resin at the light-emission wavelength of the light-emitting element.

15. An optical module according to claim 6, wherein the reflecting material includes a resin having a refractive index at the light-emission wavelength of the light-emitting element other than a refractive index of the light-absorbing resin at the light-emission wavelength of the light-emitting element.

16. A light transmitting and receiving module to be coupled with an optical fiber comprising:
an optical module according to claim 1;
an optical multiplexer and demultiplexer which conducts optical multiplexing and demultiplexing operations to emit light from the optical fiber to the light-receiving element of the optical module and to emit light from the light-emitting element of the optical module to the optical fiber; and
a housing for storing therein the optical module and the optical multiplexer and demultiplexer.

17. A light transmitting and receiving module to be coupled with an optical fiber comprising:
an optical module according to claim 4;
an optical multiplexer and demultiplexer which conducts optical multiplexing and demultiplexing operations to emit light from the optical fiber to the light-receiving element of the optical module and to emitting light from the light-emitting element of the optical module to the optical fiber; and
a housing for storing therein the optical module and the optical multiplexer and demultiplexer.

* * * * *